United States Patent [19]

Komeyama et al.

[11] Patent Number: 4,516,254
[45] Date of Patent: May 7, 1985

[54] X-RAY LITHOGRAPHIC APPARATUS

[75] Inventors: Yoshihiro Komeyama, Yokohama; Motoya Taniguchi, Kamakura, both of Japan

[73] Assignee: Hitachi, Ltd., Tokyo, Japan

[21] Appl. No.: 557,460

[22] Filed: Dec. 2, 1983

[30] Foreign Application Priority Data

Dec. 3, 1982 [JP] Japan .............................. 57-211407

[51] Int. Cl.³ ............................................. H01J 00/00
[52] U.S. Cl. ......................................... 378/34; 378/35
[58] Field of Search ..................................... 378/34, 35

[56] References Cited

U.S. PATENT DOCUMENTS 4,403,336  9/1983  Taniguchi et al. .................... 378/35

Primary Examiner—Alfred E. Smith
Assistant Examiner—T. N. Grigsby
Attorney, Agent, or Firm—Antonelli, Terry & Wands

[57] ABSTRACT

The present invention consists in an X-ray lithographic apparatus having an X-ray generator which generates X-rays, and a gastight chamber which is gastightly coupled to the X-ray generator and which holds a mask to be exposed to the X-rays, on its surface remote from the X-ray generator, characterized in that the gastight chamber is provided with a window on which a soft member softer than the mask is mounted.

6 Claims, 4 Drawing Figures

X-RAY LITHOGRAPHIC APPARATUS

BACKGROUND OF THE INVENTION

The present invention relates to an X-ray lithographic apparatus.

In general, exposure in vacuum and exposure in the atmosphere are considered as the exposure systems of X-ray lithographic apparatuses.

In the vacuum exposure system having heretofore been principally practised, a wafer is exposed to radiation with both a mask and the wafer placed in a vacuum chamber in which an X-ray source is disposed. Since the X-ray flux does not come out of the vacuum chamber, it attenuates little, and the exposure efficiency is high. Since, however, the mask and the wafer must be handled and positioned in the vacuum chamber, the problems of low available percentage etc. have been involved.

Therefore, the atmospheric exposure in which a wafer is placed in the atmosphere and is exposed to radiation has formed the mainstream.

In the atmospheric exposure system, an X-ray source is placed in a vacuum chamber, and the wafer which is as proximate to a mask as ten $\mu m$—several tens $\mu m$ is irradiated with the generated X-rays through a gastight chamber which is filled with helium gas or the like, easy to transmit the X-rays, under a pressure of approximately 1 atmosphere, as well as the mask which is mounted on one end of the gastight chamber. Accordingly, the mask must be so mounted that one surface confronts the gastight chamber filled with the helium gas or the like, while the other surface confronts the atmosphere. Moreover, since the X-rays attenuate greatly due to the helium gas or the like in the atmospheric exposure system, the mask is required to be as thin as possible. This has led to the occurrence of the problem that the mask vibrates on account of the pressure difference between the atmosphere and the gastight chamber filled with the helium gas or the like.

In this regard, a method is considered wherein the pressure difference between the atmosphere and the gastight chamber is detected and wherein the pressure of the helium gas or the like in the gastight space is controlled by a pressure regulator valve. With this method, however, a detection lag and the operation lag of the pressure regulator valve are involved. Another problem is the pressure regulation precision of the pressure regulator valve.

SUMMARY OF THE INVENTION

An object of the present invention is to eliminate the disadvantages of the prior arts, and to provide an X-ray lithographic apparatus in which a pressure in the gastight space between an X-ray source and a mask is tuned to the atmospheric pressure so as to avoid the vibrations of the mask, whereby the blurring of a pattern edge to arise at exposure is prevented, and a pattern on the mask can be clearly transferred onto a wafer.

A characterizing feature of the present invention is that a window of a member which is sufficiently softer than the mask is disposed between the gastight space and the atmosphere. Thus, when the atmospheric pressure has become higher than the pressure of the gastight space, the soft member caves in toward the gastight space before the mask, whereas when the atmospheric pressure has become lower than the pressure of the gastight space, the soft member becomes convex to tune the pressure of the gastight space and the atmospheric pressure and to prevent the vibrations of the mask. According to this method, even a minute pressure change can be prevented by employing a sufficiently soft member and forming the window near the mask.

DESCRIPTION OF THE PREFERRED EMBODIMENT:

The present invention will be concretely described with reference to FIGS. 1 to 4.

Figure 1:
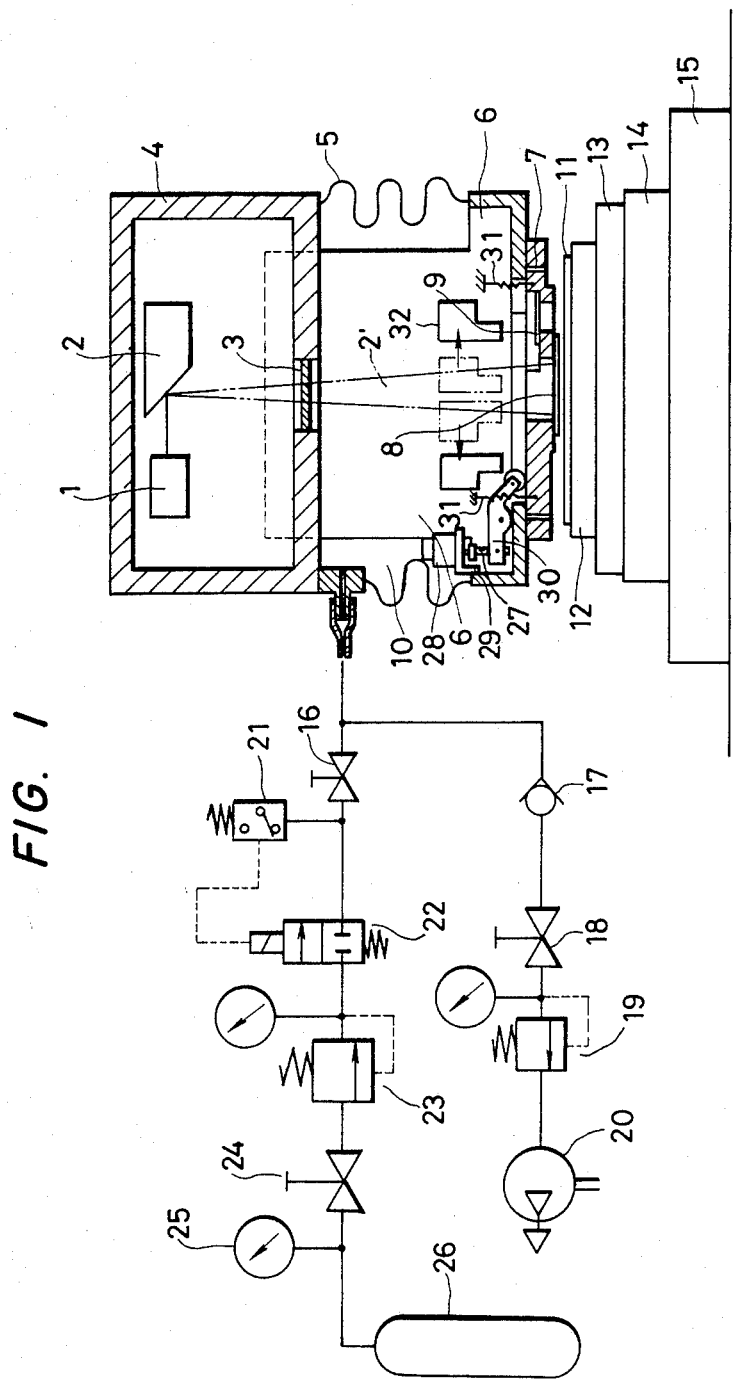
FIG. 1 is an arrangement view showing an embodiment of an X-ray lithographic apparatus basedon the atmospheric exposure system according to the present invention.

As shown in FIG. 1, an X-ray lithographic apparatus comprises an X-ray generator 4 which includes an electron gun 1, a target 2, and a window 3 made of beryllium for taking out a soft X-ray flux 2' emitted from the target 2; and a gastight chamber 10 which is connected with the X-ray generator 4, which includes a bellows 5, a holder 6 and a mask stage 7, and which is filled with helium gas under a pressure substantially equal to the atmospheric pressure. The mask stage 7 is so constructed as to be capable of adjusting, at least, its tilt relative to the holder 6, it holds a mask 8, and it has a window 9 for mounting a soft member. Further, the apparatus comprises a wafer chuck 12 which holds a wafer 11 at a predetermined spacing of ten $\mu m$ to several tens $\mu m$ from the mask 8 by vacuum suction, corrective elements (for example, piezoelectric elements vertically expanded or contracted independently) 12" which correct the deformation of the wafer 11 through a partial thin sheet member in order to keep the predetermined spacing between the mask 8 and the wafer 11, and a $\theta$-stage 13, an X-stage 14 and a Y-stage 15 which support the wafer chuck 12 drawing the wafer 11 by vacuum suction, so as to be freely movable in rotational and horizontal directions. The upper surface of the thin sheet member is formed with a stria to which a hose 12' leading to a vacuum source is connected, so that protrusions may be arrayed partially and regularly. Also a space in which the corrective elements 12" are arranged is connected to the vacuum source. In particular, the holder 6 is provided with a tilt driving mechanism 27 in order that the mask stage 7 may equalize a distance from the target 2 to the mask 8. This tilt driving mechanism 27 is constructed of a driving motor 28, a reed screw 29 thereof, and a cam lever 30 adapted to turn to engage the mask stage 7. The mask stage 7 is suspended by springs 31. In order to avoid the penumbra blurring of the X-ray flux and to adjust a magnifying power, the X-ray generator 4 is supported so as to be finely movable vertically relative to the holder 6, and the fine adjustments of the lead screw etc. are disposed. The bellows 5 connects a certain part of the X-ray generator 4 and a certain part of the holder 6 in order to define the gastight chamber 10 and to permit the X-ray generator 4 to finely move vertically relative to the holder 6 as stated above. The details of these constituents are described in EPC Patent Application No. 82105096. 0 or U.S. patent application Ser. No. 387,206 now Pat. No. 4,475,223.

In this arrangement, before reaching the surface of the wafer 11, the X-ray flux 2′ emitted from the target 2 must be transmitted through the beryllium window 3, the gastight chamber 10 filled with the helium gas, and the mask 8. The provision of the gastight chamber 10 is intended to prevent the attenuation of the X-ray flux 2′. Usually, the transmission factor of the soft X-ray flux 2′ for the beryllium window 3 is approximately 90%, the transmission factor thereof for the gastight chamber 10 is approximately 96%, and the transmission factor thereof for the mask 8 is approximately 70%, so that the amount of the soft X-rays to reach the surface of the wafer 11 decreases to approximately 60%.

In this regard, the mask 8 is required to be more thinned to the end of increasing the amount of the soft X-rays 2′ which reach the surface of the wafer 11.

However, when the mask 8 is thinned, its mechanical strength lowers, a pressure fluctuation to be described later arises in the gastight chamber 10 without the window of the soft member 9. As a result, the pressure difference between the interior of the gastight chamber 10 and the atmosphere deforms the mask 8 which has the lowest strength among the constituents of the gastight chamber 10, and it causes the vibrations of the mask. Therefore, a pattern on the mask 8 cannot be clearly transferred onto the wafer 11.

Figure 2:
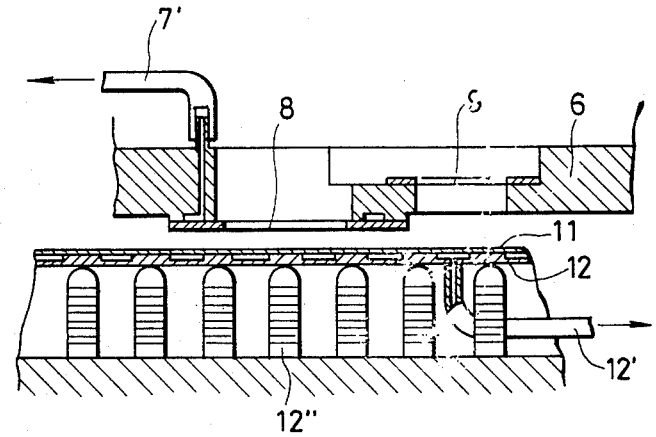
FIG. 2 is a view showing a situation before exposure in the state in which a window made of a soft member according to the present invention is provided in the wall of a gastight chamber.
Figure 3:
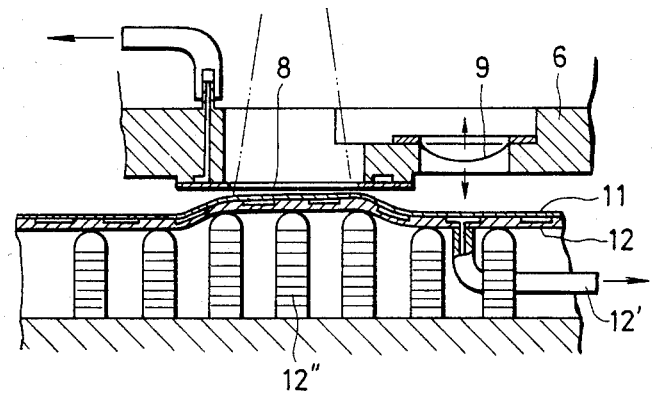
FIG. 3 is a view showing the situation of the exposure in the state in which the window made of the soft member according to the present invention is provided in the wall of the gastight chamber.

In contrast, according to the present invention, the window (about 50 mm—100 mm in diameter) made of the sufficiently soft member 9 is provided as shown in FIGS. 2 and 3. The soft member 9 is, for example, a rubber film or a polyvinyl chloride film approximately 5 $\mu$m thick. With this measure, even when the pressure difference has arisen between the gastight chamber 10 and the atmosphere, the soft member 9 is deformed before the mask 8, to tune the pressure of the gastight chamber 10 and the atmospheric pressure. Therefore, the mask 8 can be prevented from being deformed and vibrated by the pressure difference.

Figure 4:
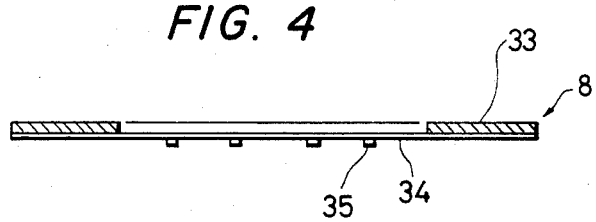
FIG. 4 is a view showing a section of a mask.

In substituting helium for the air of the gastight chamber 10, a shutoff valve 16 is closed and a shutoff valve 18 is opened, and the internal pressure of the gastight chamber 10 is reduced to 100 mmHg or so by a vacuum pump 20. Thereafter, a shutoff valve 17 is closed and the shutoff valve 16 is opened. Then, a change-over valve 22 is opened by a pressure switch 21 which is set at a pressure approximately 10 mmHg higher than the atmospheric pressure, and helium in a helium tank 26 flows into the gastight chamber 10 through a shutoff valve 24. When the internal pressure of the gastight chamber 10 has become higher than the atmospheric pressure in excess of 10 mmHg, the change-over valve 22 is closed by the pressure switch 21. When the pressure of the gastight chamber 10 has lowered due to the leakage of the helium through the suction surface of the mask 8 (the mask is not perfectly flat, but the helium leaks through the vacuum suction surface) and through the seal parts of wiring etc., the change-over valve 22 is opened by the pressure switch 21 again, to cause the helium to flow into the gastight chamber 10. The pressure in the gastight chamber 10 is held constant by repeating these operations, but minute pressure fluctuations on the order of 10 mmHg are inevitable. The pressure fluctuations, however, can be absorbed in such a way that the soft membrane member 9 which is highly sensitive is disposed in the wall of the gastight chamber 10 as described before. By way of example, the mask 8 for the soft X-ray exposure is constructed as shown in FIG. 4. The illustrated example of the mask 8 is so formed that a polyimide film 34 which has a pattern 35 made of gold (Au) and which is 3–7 $\mu$m thick is stuck on a silicon substrate 33 which is provided with an opening of about 30 mm $\times$ 30 mm.

Thus, after the spacing between the wafer and the radiate mask concentric with the X-ray source has been adjusted uniform as described in EPC Patent Application No. 82105096. 0 or U.S. patent application Ser. No. 387,206, now U.S. Pat. No. 4,475,223 the pressure fluctuations arising as stated before can be absorbed by the soft membrane member 9 without deforming the fragile mask 8.

When the soft membrane member 9 is disposed in proximity to the mask 8, the deformation of the mask 8 can be prevented more reliably. It is the best to provide the window with the soft membrane member stuck on the mask stage 7 as illustrated in the drawings.

As thus far described, according to the present invention, in an X-ray lithographic apparatus, mask vibrations (deformation) having been the problem of the atmospheric exposure system can be prevented. This brings forth the effects that a pattern on a mask can be transferred onto a wafer clearly and at high efficiency and that a way to the realization of an LSI of submicron pattern can be hewn out.

We claim:

1. In an X-ray lithographic apparatus having an X-ray generator which generates X-rays, and a gastight chamber which is gastightly coupled to the X-ray generator and which holds a mask to be exposed to the X-rays, on its surface remote from the X-ray generator; an X-ray lithographic apparatus characterized in that said gastight chamber is provided with a window on which a soft member softer than the mask is mounted.

2. An X-ray lithographic apparatus as defined in claim 1, wherein gas supply means is connected to said gastight chamber; said gas supply means comprising a gas source for preventing attenuation of the X-rays, and control means for controlling to a predetermined value a pressure of a gas to be supplied from said gas source to said gastight chamber.

3. An X-ray lithographic apparatus as defined in claim 1, wherein said window on which said soft member is mounted has an area larger than that of a portion of the mask to be exposed to the X-rays.

4. An X-ray lithographic apparatus as defined in claim 1, wherein said soft member is a film made of polyvinyl chloride.

5. An X-ray lithographic apparatus as defined in claim 1, wherein said soft member is disposed on that lower surface of said gastight chamber on which the mask is mounted.

6. An X-ray lithographic apparatus as defined in claim 1, wherein said soft member is disposed on a mask stage which holds the mask by suction and which is constructed, at least, tiltably.

* * * * *